United States Patent [19]

Ohashi et al.

[11] Patent Number: 4,879,153
[45] Date of Patent: Nov. 7, 1989

[54] INTEGRATED CIRCUIT CARD

[75] Inventors: Masato Ohashi, Kobe; Shiyojiro Kodai, Itami, both of Japan

[73] Assignees: Ryoden Kasei Co., Ltd.; Mitsubishi Denki Kabushiki Kaisha, both of Japan

[21] Appl. No.: 241,895

[22] Filed: Sep. 8, 1988

[30] Foreign Application Priority Data

Oct. 20, 1987 [JP] Japan .................. 62-264953

[51] Int. Cl.⁴ .......................... B32B 1/04; G09F 3/02
[52] U.S. Cl. ................................. 428/76; 428/137; 428/332; 428/339; 428/500; 428/518; 428/522; 428/901; 235/441; 235/487; 235/488; 235/492; 40/625; 40/630; 174/685
[58] Field of Search ............... 428/137, 195, 211, 901, 428/76, 332, 339, 500, 518, 522; 174/68.5; 235/441, 487, 488, 492; 40/625, 630

[56] References Cited

U.S. PATENT DOCUMENTS

| 4,222,516 | 9/1980 | Badet et al. | 235/492 |
| 4,417,413 | 11/1983 | Hoppe et al. | 40/630 |
| 4,450,024 | 5/1984 | Haghiri-Tehrani et al. | 156/108 |
| 4,617,216 | 10/1986 | Haghiri-Tehrani et al. | 428/67 |
| 4,639,585 | 1/1987 | Haghiri-Tehrani et al. | 235/487 |

FOREIGN PATENT DOCUMENTS 2081644 2/1982 United Kingdom ................ 428/901

Primary Examiner—Ellis P. Robinson
Assistant Examiner—P. J. Ryan
Attorney, Agent, or Firm—Leydig, Voit & Mayer

[57] ABSTRACT

An IC card has a laminated card body in which an IC module is housed. The card body is formed by lamination of a plurality of sheets, at least the sheet which contacts the bottom surface of the IC module being made of a synthetic paper having good flexing resistance. The remaining sheets are made of a rigid polyvinyl chloride. The card body is formed by conventional laminating processes.

11 Claims, 2 Drawing Sheets

INTEGRATED CIRCUIT CARD

BACKGROUND OF THE INVENTION

This invention relates to an integrated circuit card (hereinafter referred to as an IC card), and more particularly it relates to an IC card having improved resistance to flexing.

Conventional thin IC cards are made by laminating a plurality of rigid polyvinyl chloride sheets in the manner stipulated by JIS (Japan Industrial Standards) X6301. FIGS. 1 and 2 are cross-sectional views of two different conventional IC cards of the types of which the present invention relates.

The type of conventional IC card illustrated in FIG. 1 comprises a card body 1 and an IC module 4 which is housed inside the card body 1. The card body 1 has a laminated core 2 comprising four opaque core sheets 2a and two transparent overlays 3 on the top and bottom surfaces of the core 2. The core sheets 2a and the overlays 3 are laminated into a single body under heat and pressure. The card body 1 has a hole formed therein into which the IC module 4 is inserted. The dimensions of the hole are such that the top surface of the IC module 4, which has electrodes 5 formed thereon, is flush with the top surface of the card body 1. An unillustrated bonding agent is applied between the mutually contacting surfaces of the card body 1 and the IC module 4. A design is formed by silk screen printing or other means on the surfaces of the core sheets 2a which contact the transparent overlays 3.

The type of conventional IC card illustrated in FIG. 2 differs from that of FIG. 1 in that the IC module 4 is embedded inside the card body 1 and the top surface of the IC module 4 is partially covered by the top overlay 3. However, the structure of this type of IC card is otherwise identical to the IC card illustrated in FIG. 1.

The core sheets 2a and the overlays 3 of these conventional IC cards are generally made of rigid polyvinyl chloride sheets because, among other reasons, sheets of this type can be embossed with information such as the name and account number of the owner of the card. However, polyvinyl chloride sheets do not have good resistance to flexing. As the core sheets 2a are more flexible than the IC module 4 during bending of the IC card, stress concentrations develop in the regions 6 of the core sheets 2a near the corners of the bottom side of the IC module 4. When the IC is subjected to repeated bending, undesirable cracks often develop in these regions 6, sometimes resulting in the splitting of the IC card.

SUMMARY OF THE INVENTION

Accordingly, it is an object of the present invention to provide an IC card which has improved resistance to flexing.

It is another object of the present invention to provide an IC card having improved resistance to flexing which can be manufactured using conventional equipment and techniques for manufacturing an IC card.

An IC card in accordance with the present invention comprises a card body having a laminated core and an IC module which is housed in a hole formed in the core. Of the sheets forming the laminated core, at least the sheet which is in contact with the bottom surface of the IC module is made of synthetic paper. Synthetic paper has good flexing resistance and is not subject to cracks when it undergoes repeated bending. Therefore, the formation of cracks in the portion of the card body adjoining the corners of the IC module can be prevented.

Various types of synthetic papers can be employed in the present invention, including film papers and synthetic-fiber papers, so long as the synthetic paper has good flexing resistance. Some examples of synthetic papers which can be employed are polypropylene paper and polyester fiber paper. A synthetic-fiber paper formed by mixing pulp with synthetic-fiber paper can also be employed, but in order to obtain a paper which is easy to emboss, preferably the amount of pulp which is added is not large.

BRIEF DESCRIPTION OF THE DRAWINGS

In the figures, the same reference numerals indicate the same or corresponding parts.

DESCRIPTION OF THE PREFERRED EMBODIMENTS

Figure 1:
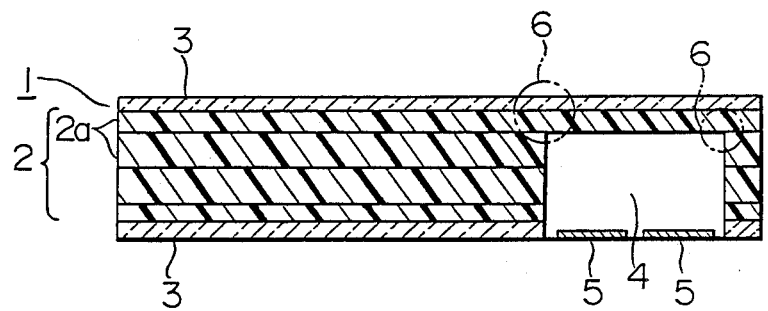
FIG. 1 is a cross-sectional view of a conventional IC card.
Figure 2:
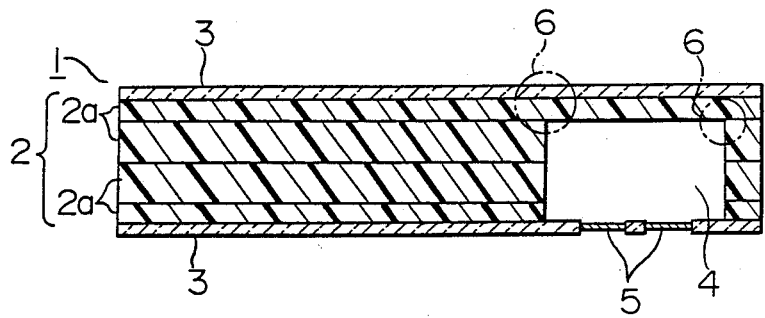
FIG. 2 is a cross-sectional view of another type of conventional type of IC card.

Hereinbelow, a number of preferred embodiments of an IC card in accordance with the present invention will be described while referring to the accompanying drawings, FIG. 3 of which illustrates a first embodiment. As shown in this figure, an IC module 4 is housed inside a card body 1 comprising a laminated core 2 and two transparent overlays 3 which are attached to the top and bottom surfaces of the laminated core 2. As in the conventional example of FIG. 1, the top surface of the IC module 4, which has electrodes 5 formed thereon, is flush with the top surface of the card body 1. The laminated core 2 is formed from four core sheets 2a and 2b. The top three core sheets 2a are opaque, rigid polyvinyl chloride sheets made of a vinyl chloride polymer, a vinyl chloride-vinyl acetate copolymer, or the like. The overlays 3 are also made of the same or a similar rigid polyvinyl chloride. However, the bottom core sheet 2b which contacts the bottom surface of the IC module 4 is made of polypropylene synthetic paper, which has good flexing resistance.

Figure 3:
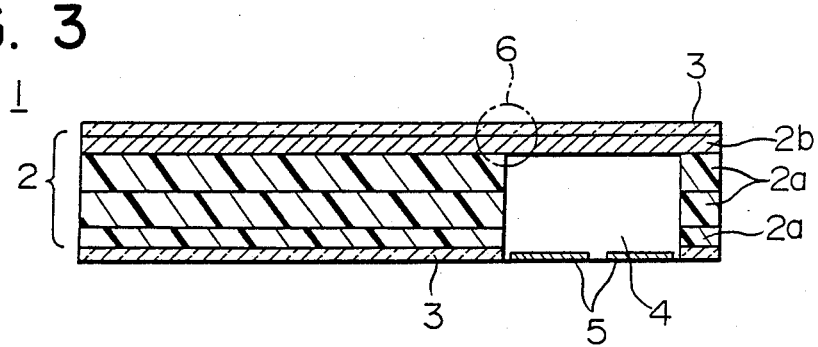
FIG. 3 is a cross-sectional view of an IC card in accordance with a first embodiment of the present invention.

The embodiment of FIG. 3 can be manufactured by the same lamination techniques employing thermal bonding of the polyvinyl chloride sheets and with the same equipment as is used for the manufacture of conventional IC cards. Thermal bonding of polyvinyl chloride sheets is a well-known technique. The surfaces of the core sheets 2a and 2b which contact the overlays 3 can be decorated with a desired pattern by silk screen printing. At the time of laminating, the surfaces of the synthetic paper sheet 2b are coated with a copolymer polyester resin, the overlays 3 are superimposed on the core sheets 2a and 2b, and all the sheets are formed into an integrated card body 1 by laminating under heat and pressure at a temperature of 120° C. under a pressure of 30 kg per square cm.

Figure 4:
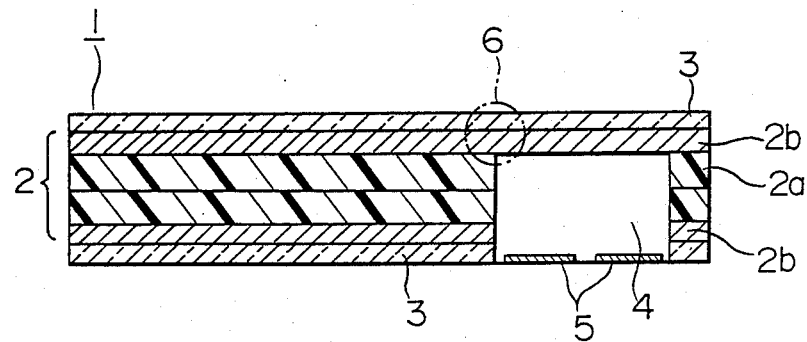
FIG. 4 is a cross-sectional view of an IC card in accordance with a second embodiment of the present invention.

FIG. 4 illustrates a second embodiment of the present invention in which the core 2 of the card body 1 has two synthetic paper sheets 2b which are symmetrically disposed with respect to the center of the card body 1 on the top and bottom sides of polyvinyl chloride sheets 2a. By employing two symmetrically-disposed synthetic paper sheets 2b, warping of the card body 1 due to the differences between the coefficients of thermal expansion of the rigid polyvinyl chloride sheets 2a and 3 and that of the synthetic paper sheets 2b can be suppressed as much as possible. The structure of this embodiment is otherwise identical to that of the embodiment of FIG. 3.

Figure 5:
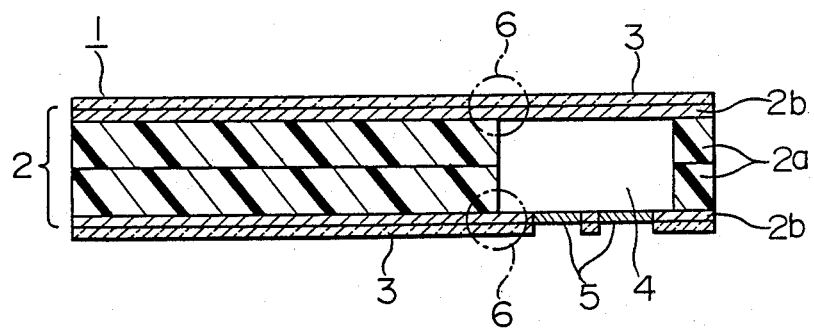
FIG. 5 is a cross-sectional view of an IC card in accordance with a third embodiment of the present invention.

FIG. 5 illustrates a third embodiment of an IC card according to the present invention in which an IC module 4 is buried inside a card body 1. The core 2 of the card body 1 has two polyvinyl chloride sheets 2a at its center and two synthetic paper sheets 2b which are symmetrically disposed with respect to the center of the core 2 on the top and bottom thereof. The IC module 4 is sandwiched between the two synthetic paper sheets 2b, one of which contacts the bottom surface and the other of which contacts the top surface of the IC module 4.

In an IC card in accordance with the present invention, the portions 6 of the core 2 of the card body 1 which adjoin the corners of the IC module 4 and which are subject to stress concentrations during bending of the card are strengthened by the use of synthetic paper sheets 2b which have much greater resistance to flexing than polyvinyl chloride sheets. According, the generation of cracks in these portions 6 due to repeated bending can be suppressed, and an IC card of the present invention can exhibit 2–3 times the resistance to flexing of conventional IC cards.

As the total thickness of the synthetic paper sheets 2b increases, it becomes more difficult to emboss of an IC card. Therefore, if the IC card is to be embossed, the thickness of the synthetic paper sheets 2b is preferably at most ⅓ of the total thickness of the card body 1. However, in cases in which no embossing is performed, there is no particular limit on the thickness of the synthetic paper sheets 2b.

In the illustrated embodiments, the laminated cores 2 are formed from a total of four core sheets 2a and 2b, but there is no restriction on the number of sheets which are laminated together to form the core 2. In addition, the illustrated embodiments employ either one or two synthetic paper sheets 2b, but a larger number may be employed.

What is claimed is:

1. An integrated circuit card comprising:
   an integrated circuit module housed entirely within the integrated circuit card, said module having a top surface and a bottom surface; and
   a laminated card body which comprises outer layers overlying opposite surfaces of a laminated core formed from a plurality of laminated sheets, said core having a hole formed therein in which said integrated circuit module is housed, one of said sheets being in direct contact with the bottom surface of said integrated circuit module, wherein at least the sheet which is in contact with the bottom surface of said integrated circuit module is made of synthetic paper.

2. An integrated circuit card as claimed in claim 1 wherein said synthetic paper is a film paper.

3. An integrated circuit card as claimed in claim 1 wherein said synthetic paper is a synthetic-fiber paper.

4. An integrated circuit card as claimed in claim 1 wherein the total thickness of the sheets which are made of synthetic paper is at most one third the total thickness of said card body.

5. An integrated circuit card as claimed in claim 1 wherein at least two of the laminated sheets forming said laminated core are made of synthetic paper, and said synthetic paper sheets are symmetrically disposed with respect to the thickness of said card body.

6. An integrated circuit card as claimed in claim 5 wherein the top surface of said integrated circuit module is flush with a surface of said card body.

7. An integrated circuit card as claimed in claim 5 wherein said integrated circuit module is disposed within said laminated core, one of said synthetic paper sheets contacting the bottom surface of said integrated circuit module and another of said synthetic paper sheets contacting the top surface of said integrated circuit module.

8. An integrated circuit card as claimed in claim 1 wherein said laminated sheets which are not formed of synthetic paper are opaque sheets of a rigid vinyl chloride.

9. An integrated circuit card as claimed in claim 8 wherein said vinyl chloride is polyvinyl chloride.

10. An integrated circuit card as claimed in claim 8 wherein said vinyl chloride is a vinyl chloride-vinyl acetate copolymer.

11. An integrated circuit card as claimed in claim 8 wherein said outer layers comprise transparent plastic overlays which cover said laminated core.

* * * * *